United States Patent [19]

Revesz et al.

[11] 3,977,905

[45] Aug. 31, 1976

[54] SOLAR CELL WITH NIOBIUM PENTOXIDE ANTI-REFLECTIVE COATING

[75] Inventors: Akos G. Revesz; Joseph Lindmayer, both of Bethesda, Md.

[73] Assignee: Communications Satellite Corporation (Comsat), Washington, D.C.

[22] Filed: June 20, 1975

[21] Appl. No.: 588,935

Related U.S. Application Data

[62] Division of Ser. No. 331,741, Feb. 13, 1973, abandoned.

[52] U.S. Cl. ............................... 136/89; 29/572; 156/3; 156/8; 204/14 N; 204/38 B; 204/46 R; 427/75; 427/162

[51] Int. Cl.² ........................................ H01L 31/04

[58] Field of Search ............... 136/89; 106/55; 427/162

[56] References Cited

UNITED STATES PATENTS 3,106,489 10/1963 Lepselter .................... 136/89 X

*Primary Examiner*—John H. Mack
*Assistant Examiner*—Aaron Weisstuch
*Attorney, Agent, or Firm*—Sughrue, Rothwell, Mion, Zinn and Macpeak

[57] ABSTRACT

A niobium pentoxide ($Nb_2O_5$) anti-reflective coating for use on a solar cell responsive to light in the short wavelength region.

2 Claims, 9 Drawing Figures

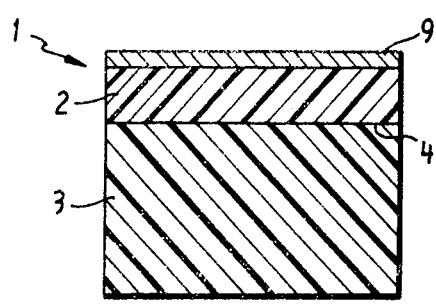 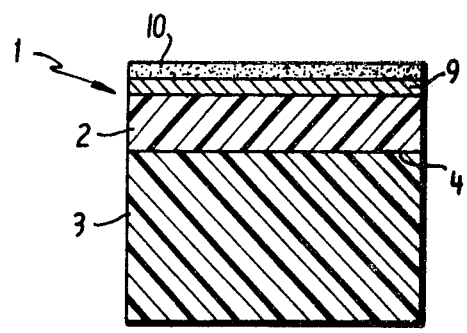
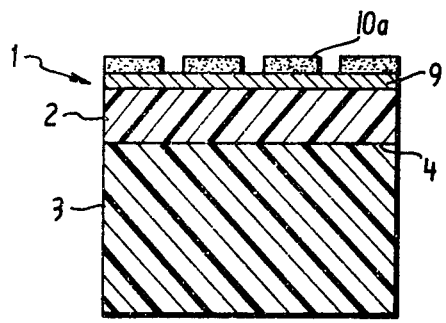 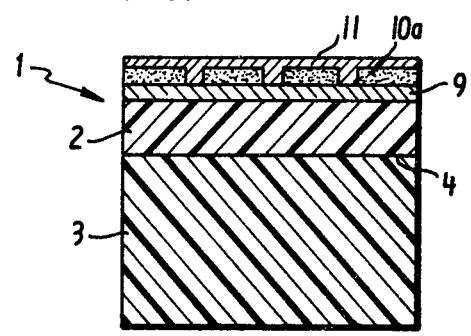
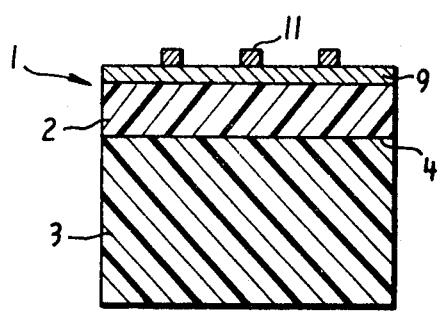 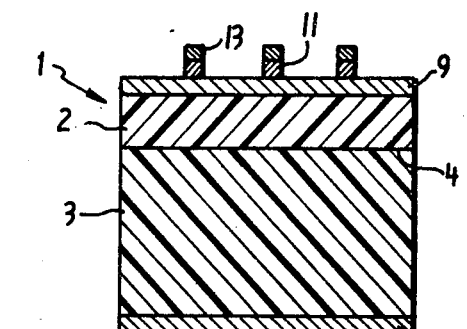
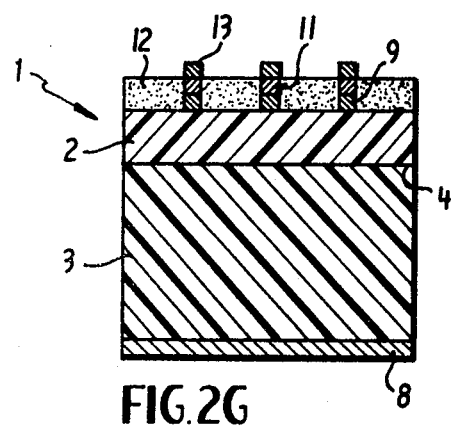

SOLAR CELL WITH NIOBIUM PENTOXIDE ANTI-REFLECTIVE COATING

This is a division of application Ser. No. 331,741, filed Feb. 13, 1973, now abandoned.

BACKGROUND OF THE INVENTION

This invention relates to solar cells and, more particularly, to an anti-reflective coating for solar cells that are responsive to light across the entire visible light spectrum including light in the short wavelength region.

The use of silicon solar cells, which convert light energy to electrical energy is well known in both terrestrial and outer space applications. Light incident upon a silicon solar cell is absorbed by the bulk semiconductor of the cell and results in the generation of electron-hole pairs (i.e., carriers). Ideally, the carriers are spatially separated by the semiconductor junction without recombination at the junction. The carriers may be collected at opposite surfaces of the solar cell by metallic current collectors thereby creating a current flow.

The efficiency (i.e., electrical power output/power input of incident useful light) of a solar cell is directly related to the amount of useful light entering the silicon cell. The useful light for a given solar cell may be defined as electromagnetic energy at those wavelengths which, when absorbed by the solar cell, will result in the generation of carriers at the cell junction. However, the efficiency of the solar cell is limited due to reflection of useful light striking the top surface of the solar cell. To reduce this problem of light reflection, an anti-reflective coating is applied to the surface through which light enters the solar cell.

As is well known in the art, the particular environment in which a solar cell will be used will determine the specific mechanical, chemical and optical properties that its anti-reflective coating must have. In space applications, where reliability in a hostile environment and over extended time periods is required, the presence of these properties is essential to a successful mission.

As a fundamental optical property, the anti-reflective coating should reduce reflection of the useful light. In space applications, where a cover slide, usually quartz, is placed over the anti-reflective coating to shield the solar cell from harmful radiation, the index of refraction of the anti-reflective coating should be between that of the quartz cover slide and the underlying solar cell, generally in the range of 2.0–2.5. Another required optical property of an anti-reflective coating is transparency. The anti-reflective coating should not absorb any of the useful light, but should enable passage of such light to the underlying solar cell. In the final analysis, the optical properties required for an anti-reflective coating are dependent upon the refractive indices of both the underlying solar cell and the cover slide, as well as the wavelength response of that solar cell.

In a co-pending application entitled "Fine Geometry Solar Cell" by Joseph Lindmayer, Ser. No. 184,393, now U.S. Pat. No. 3,811,954, assigned to the assignee of the present invention, a novel solar cell is described for which useful light includes light across the entire visible spectrum, particularly light in the blue-violet region of the spectrum. This region corresponds to the short wavelength region of light at about 0.3–0.5 microns. Heretofore, a solar cell with this capability has not been known in the art. In order to utilize efficiently a solar cell having a wavelength response that extends into the short wavelength region, it is necessary to employ an anti-reflective coating that would not absorb light across the entire visible spectrum, i.e., 0.3–1.1 microns, and would have a refractive index between that of the coverslide and the solar cell.

The anti-reflective coating also must satisfy certain mechanical and chemical criteria. In addition to environmental and life-time considerations, these criteria would be determined by the physical characteristics of the solar cell. A solar cell responsive to light in the short wavelength region, particularly a cell constructed in accordance with the teachings of the Lindmayer application referenced above, would require an anti-reflective coating to satisfy certain specific criteria. For example, in the short wavelength responsive solar cell described in the application to Lindmayer, the n-p junction is only about 1000–2000 A from the top surface of the solar cell. Under these conditions the anti-reflective coating would damage the shallow junction if the coating penetrated into the solar cell. Also, any mechanical stress produced at the anti-reflective coating — semi-conductor interface must be small so that such stress will not damage the junction.

In addition, the anti-reflective coating should not degrade upon exposure to ultraviolet light in a vacuum. The effect of such degradation could be a change in the index of refraction of the anti-reflective coating and the absorption of light at short wavelengths. Also, with respect to silicon solar cells, there is a phenomena known as dispersion whereby the index of refraction of the silicon becomes greater at the shorter wavelengths. Therefor, the anti-reflective coating should have a relation to wavelength that matches the variable refractive index of silicon.

Still other criteria of an anti-reflective coating relate to its stability, adhesion qualities and hardness. The anti-reflective material should be chemically stable in that it should not change composition during processing where it may be exposed to temperature, chemicals and moisture; and should not change during shelf storage in order to assure constant optical properties. The adhesion of the anti-reflective coating to the solar cell should be excellent so as to ensure that delamination would not occur during processing or exposure to moisture or temperature cycling. Finally, the anti-reflective material should be hard enough so that it would not be damaged, during manufacture or use, particularly during coverslide attachment.

An anti-reflective material which meets all the above criteria has been described in a co-pending application entitled "Tantalum Pentoxide Anti-Reflective Coating" by Joseph Lindmayer, et al, Ser. No. 249,024, now abandoned, assigned to the assignee of the present invention. The anti-reflective coating described in the application to Lindmayer, et al comprises amorphous, tantalum pentoxide ($Ta_2O_5$). The present application describes another anti-reflective coating which meets all of the above criteria but has the advantage of easier manufacture under low temperature conditions.

SUMMARY OF THE INVENTION

Niobium pentoxide ($Nb_2O_5$) is used as an anti-reflective coating, particularly with solar cells having an extended response to light in the short wavelength region (i.e., 0.3–0.5 microns). The $Nb_2O_5$ will not absorb useful light greater than 0.35 microns and will have an index of refraction of approximately 2.4.

BRIEF DESCRIPTION OF THE DRAWINGS

FIGS. 2A – 2G are side views of the solar cell of FIG. 1 at various stages of the process for making the solar cell including the anti-reflective coating of the present invention.

DETAILED DESCRIPTION OF THE DRAWINGS

Figure 1:
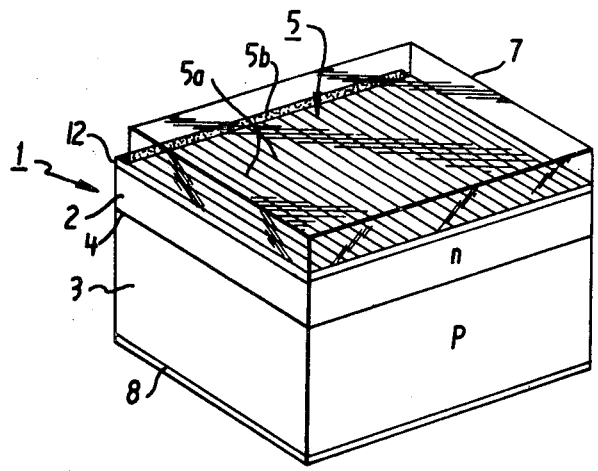
FIG. 1 is a 3-dimensional view of a solar cell having a niobium pentoxide anti-reflective coating.
Figure 3:
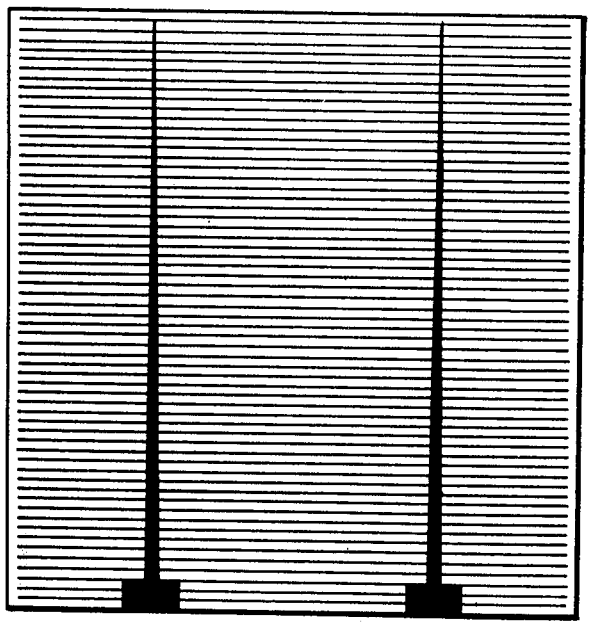
FIG. 3 shows a photomask used during the process of making the solar cell of FIG. 1.

Prior to a discussion of the present invention, it should be realized that such dimensions as the size of the solar cell and the relative thickness of the several layers shown in FIG. 1 are not representative of an actual solar cell, but are shown merely for purposes of illustration. In addition, the present invention comprising the use of $Nb_2O_5$ as an anti-reflective coating has applicability to solar cells in general; however, for purposes of describing a preferred embodiment of the invention this disclosure will relate to a silicon solar cell responsive to light in the short wavelength region as described in the Fine Geometry Solar Cell application to Lindmayer (Ser. No. 184,393), now U.S. Pat. No. 3,811,954.

Shown in FIG. 1 is a diagram of a silicon solar cell 1 having a layer 2 of first type conductivity separated from a layer 3 of opposite type conductivity by a junction 4. In the preferred embodiment, the silicon solar cell 1 comprises an n-type layer 2 separated from a p-type layer 3 by an n-p junction 4 that is 1000 A from the top surface of layer 2. As is well known in the solar cell art, the p-type bulk material with n-type diffused layer as described, is preferred over an n-type bulk material with p-type diffused layer; however, the present invention may be used in either case.

On the top surface of n-type layer 2 is a metallic grid 5 for collection of carriers generated during the photovoltaic process. As will be more fully described below, an anti-reflective coating 12 covers those areas of the top surface of layer 2 not occupied by the metallic grid 5. The metallic collector grid 5 may be of a fine geometry type comprising metallic fingers 5a of about 1–20 microns in width, as disclosed in the above mentioned application to Lindmayer, entitled "Fine Geometry Solar Cell" or any other metallic collector grid known in the art. In accordance with the present invention the anti-reflective coating 12 comprises $Nb_2O_5$.

A conventional quartz cover slide 7 covers the anti-reflective coating 12 and grid 5 except for the bus bar 5b of grid 5. On the bottom of p-type layer 3 is a conventional metallic contact 8 which may cover the entire bottom surface of layer 3.

In the preferred embodiment of the invention, the niobium pentoxide coating is applied to a properly sized semiconductor wafer having a shallow n-p junction beneath the surface to be coated by the niobium pentoxide. Reference should be made to FIGS. 2A – 2G for an illustration of a side view of the wafer during the successive steps of a preferred process for coating a solar cell with $Nb_2O_5$.

The preparation of this wafer does not form a part of the present invention but a typical method will be described briefly for background purposes. The starting point is a slice of silicon which is cut into a predetermined size suitable for use as a solar cell. Then, the silicon slice is subjected to a diffusion process by which an impurity (typically phosphorus) will be diffused into one surface of the silicon to provide the n-p junction 4 that is approximately 1000 A from the top surface of layer 2, as is shown in FIG. 2A. A preferred procedure for diffusing the shallow junction into the solar cell is described in a copending application to Lindmayer entitled "Method for the Diffusion of Impurities into a Semiconductor" Ser. No. 331,740, now U.S. Pat. No. 3,895,975 titled "Method for the Post-Alloy Diffusion of Impurities into a Semiconductor" and assigned to the assignee of the present invention.

Referring to FIG. 2A there is shown a silicon slice having a layer 2 of n-type conductivity separated from a layer 3 of p-type conductivity by a shallow p-n junction 4. A layer 9 of elemental niobium is shown.

In the first step of the present invention, the slice of silicon 1 having the required n-p junction 4 will have a layer 9 of elemental niobium evaporated over the entire top surface 2 of the solar cell. In a preferred embodiment of the invention, the evaporation of niobium may take place by means of the standard electron beam evaporation process. The niobium layer 9 is approximately 250 A thick (±25 A); however, the layer may be 100 A or greater, depending upon the desired thickness of the resultant oxide. The oxide thickness should be equal to one-fourth of the wavelength of light in the center of the spectrum of useful light for a particular solar cell. A 200 A layer of niobium may be oxidized to a 550 A layer of niobium pentoxide. Although the electron beam evaporation technique is well known in the art, certain considerations should be recognized. In order to assure proper deposition, a high purity niobium source, small enough to prevent undue thermal radiation from the hot niobium metal, should be bombarded by the electron beam in a high vacuum. In addition, the p-n silicon slice should be shielded from any electron damage which may result from the beam of electrons focused on the niobium. A shield, comprising a positively charged metal electrode screen, which will attract any stray electrons, may be used. The niobium metal itself should be free of any impurities which, if deposited on layer 2, may diffuse into layer 2 during this or subsequent steps of the coating process and thereby damage the p-n junction 4 of the silicon solar cell.

In the second step, a layer of photo-resist material 10 is placed on the entire top surface of the niobium layer 9. The photo-resist 10 may be any commercially available photo-resist used in the photoligraphic process of manufacturing microcircuits such as the AZ-111 resist manufactured by the Shipley Company of Los Angeles, California or other photo-resists available from the Kodak Corporation of Rochester, New York. The AZ-111 resist is a "positive" resist that becomes water soluble after exposure and development; however a "negative" resist that becomes insoluble after exposure and development could also be used. In order to prepare the desired pattern of developed photo-resist a photo-mask having a pattern which will pass light, identical to the pattern desired for the top metallic grid 5 as seen in FIG. 1 (for a positive photo-resist; a negative photo-resist would have a photo-negative pattern), is placed over the photo-resist 10. Next, the top surface of layer 9 covered by the photo-resist is exposed to ultraviolet light through the photo-mask. Then, the photo-mask is removed and the layer of photo-resist developed with the developer recommended by the manufacturer for the AZ-111 photo-resist. The solar cell is rinsed in water or other solvent recommended by the manufacturer, thereby removing the soluble developed photo-resist which was exposed to light and leaving a pattern of developed photo-resist material 10a on the top surface of layer 9 as shown in FIG. 2C. At this point, the pattern of photo-resist material 10a is the photo-negative of the metallic grid pattern 5 to be eventually placed on the top surface of layer 2.

In the third step as shown in FIG. 2D, a metal contact layer 11 such as a mixture of chrome and gold approximately 2000 A thick is deposited, by vacuum evaporation over the entire top surface of the solar cell including photo-resist 10a and the pattern of niobium 9. During the preferred deposition process, initially pure chromium is evaporated, with gold gradually being mixed into the metal deposit. Toward the end of the evaporation process, the chromium is phased out and only pure gold completes the contact. The conditions for this process may be found in standard texts. A description of this technique is not considered necessary due to the familiarity of this type of multiple element evaporation process in the art.

The fourth step in the process is to remove the developed photo-resist material 10a from the surface of elemental niobium 9. Removal of the developed photo-resist 10a is accomplished by the well known "lift-off" technique in which the developed photo-resist to be lifted off is dipped in acetone, or some other chemical recommended by the manufacturer for removal of the developed AZ-111. The acetone is contained in an ultrasonic bath to facilitate removal of the developed photo-resist 10a. The result of the "lift-off" process is to remove not only the photo-resist 10a, but also the metallized layer 11 above the photo-resist. This lift-off process will leave exposed areas of elemental niobium and a pattern of chrome and gold on the top surface of the cell. The maximum thickness of the chrome and gold should be about 2000 A to enable the underlying developed photo-resist to be lifted off easily. The resultant cell structure is shown in FIG. 2E.

In the fifth step, a standard electroplating technique may be used to deposit a layer of silver 13 over the chrome and gold layer 11 to build up the thickness of the metallic grid to approximately 5 microns. At the same time, the silver back contact 8 having a thickness of 5 microns will be plated on the back layer 3. It has been found that the silver will not plate out onto the elemental niobium during this process, thereby leaving a silver coated finger pattern over a niobium layer on one side of the cell and a silver back contact on the other side.

In the final step, the silicon solar cell with the silvered metallic contact pattern and elemental niobium surface is exposed to oxygen in either a thermal or anodic oxidation process. In thermal oxidation, the silicon slice is heated in the air at a temperature of 400°C for 3 minutes. The parameters may be in the range of 350°–450°C for 3–5 minutes and should be selected to provide a uniform oxide without grain boundaries (non-crystal). In addition, it should be recognized that higher temperatures will induce undesired alloying of the chrome and gold with the bulk semiconductor, due to the entectic temperature of these matters while lower temperatures will allow sufficient time for diffusion of chrome or gold atom into the semiconductor junction area. Under the proper conditions, niobium pentoxide is formed having a resulting index of refraction of 2.4. It should be noted that the remaining elements of the cell are unaffected since at that temperature and times, the silver will not oxidize and thereby will remain in its elemental state. In an alternative oxidation technique, known as anodic oxidation, a platinum electrode as the cathode and silicon slice as the anode would be used. Both electrodes are immersed in an electrolyte and a current allowed to pass therethrough. As one example, the anodic oxidation process may last for approximately 20 minutes commencing with an initial current of 1 milliampere. The use of organic, non-aqueous electrolyte, such as tetrahydrofurfuryl alcohol is preferred since this will result in a uniform, niobium pentoxide coating which firmly adheres to the top surface of layer 2. The result of both thermal or anodic oxidation is a layer 12 of niobium pentoxide on the top surface of layer 2 as shown in FIG. 2G. The layer of niobium pentoxide would be approximately 550 A thick in order to produce a quarter wave match at 0.5 microns.

The niobium layer 9 between the silicon surface 2 and the metallic layer 11 provides an excellent contact for the collection of carriers by metallic grid 5.

It should be recognized that cleaning steps may be required at various places in the described process to improve the purity of the resultant product. However, since these steps are well known in the art and do not affect the basic concept of the present invention, they have not been included in this specification.

We claim:

1. A solar cell responsive to light, including light in the short wavelength region of the light spectrum between 0.3 and 0.5 microns, and having an anti-reflective coating over the primary surface of the solar cell through which light enters, which coating does not absorb or reflect useful light including short wavelength light, the improvement comprising an anti-reflective coating consisting of niobium pentoxide.

2. A silicon solar cell having a top and bottom surface and being responsive to light in the short wavelength region of the visible spectrum, comprising: a first semiconductor layer of first type conductivity, a second semiconductor layer of second type conductivity, the interface between said layers defining a junction located less than 2,500 A below the top surface of said cell, a first current collector on the top surface of said cell, a second current collector on the bottom surface of said cell, and a coating of niobium pentoxide disposed on the top surface of said cell to enable substantially all of said light to enter the first layer through those areas of said top surface which are not occupied by said first current collector.

* * * * *